(12) United States Patent
Bauer

(10) Patent No.: US 9,291,651 B2
(45) Date of Patent: Mar. 22, 2016

(54) FEEDTHROUGH INSULATOR

(75) Inventor: Alberto Bauer, Tierra Verde, FL (US)

(73) Assignee: GREEN SEAS VENTURES, LTD., Tortola (VG)

( * ) Notice: Subject to any disclaimer, the term of this patent is extended or adjusted under 35 U.S.C. 154(b) by 52 days.

(21) Appl. No.: 14/233,787

(22) PCT Filed: Jul. 25, 2012

(86) PCT No.: PCT/IT2012/000231
§ 371 (c)(1),
(2), (4) Date: Jan. 20, 2014

(87) PCT Pub. No.: WO2013/021402
PCT Pub. Date: Feb. 14, 2013

(65) Prior Publication Data
US 2014/0145706 A1 May 29, 2014

Related U.S. Application Data

(60) Provisional application No. 61/574,565, filed on Aug. 5, 2011.

(51) Int. Cl.
*G01R 1/20* (2006.01)
*H01B 17/26* (2006.01)
*G01R 19/00* (2006.01)
*H01B 17/00* (2006.01)
*G01R 15/14* (2006.01)

(52) U.S. Cl.
CPC .......... *G01R 19/0046* (2013.01); *H01B 17/005* (2013.01); *G01R 15/142* (2013.01); *H01B 17/26* (2013.01)

(58) Field of Classification Search
CPC ............. G01R 19/0046; G01R 15/142; H01B 17/005; H01B 17/26
USPC .................... 324/126; 174/142, 388
See application file for complete search history.

(56) References Cited

U.S. PATENT DOCUMENTS 2,337,805 A * 12/1943 Erickson ........................ 175/423
3,580,986 A * 5/1971 Misare ........................... 174/73.1
(Continued)

FOREIGN PATENT DOCUMENTS

| DE | 4315772 A | 11/1994 |
| EP | 0510426 A | 10/1992 |
| EP | EP0933639 A2 * | 1/1999 |
| EP | 0933639 A | 8/1999 |

(Continued)

OTHER PUBLICATIONS

EP0510426A2, Hafner, Yves; Aug. 4, 1992; see attached documents pp. 1-10.*

*Primary Examiner* — Jermele M Hollington
*Assistant Examiner* — Farhana Hoque
(74) *Attorney, Agent, or Firm* — Andrew Wilford

(57) ABSTRACT

A feedthrough insulator is characterized by the fact to comprises: >-a central rod (10) which extends longitudinally with respect its longitudinal axis (10y); >-a sleeve (20) positioned coaxial around said rod of connection (10) with the respective circular shell (21) radially spaced (D-21) with respect to the central rod (10); >-a sensor (30) of electric field and/or of magnetic field, positioned in proximity of the inner surface (22) of said shell (21) of the sieeve (20); and >-a carrying body (40) formed by dielectric material able to contain and to embed said central rod (10), said sieeve (20) and said sensor (30) of electrical field and/or of magnetic field.

16 Claims, 4 Drawing Sheets

(56) References Cited

U.S. PATENT DOCUMENTS 7,364,454 B2 * 4/2008 Brus .......................... 439/441
8,471,150 B2   6/2013 Emilsson

FOREIGN PATENT DOCUMENTS

| FI | EP 0933639 A2 * | 8/1999 | ........... G01R 15/181 |
| GB | 620822 B | 3/1949 | |

* cited by examiner

FEEDTHROUGH INSULATOR

CROSS REFERENCE TO RELATED APPLICATIONS

This application is the US-national stage of PCT application PCT/IT2012/000231 filed 25 Jul. 2012 and claiming the priority of American patent application 61/574,565 itself filed 5 Aug. 2011.

FIELD OF THE INVENTION

The present invention concerns a feedthrough insulator for electrical transformer tanks, electrical boxes, and other similar structures, in which the feedthrough insulator is able to sense the electrical field and/or the magnetic field generated by the live rod of connection of the same insulator, with the purpose, for example, to determine the value of the voltage and/or the value of the current of the same live connecting rod in relationship with the fields sensed.

More in particular, the present invention concerns a feedthrough insulator of the above type able to sense the electric field and/or the magnetic field generated by the live connecting rod without being affected by any surrounding electrical fields and/or magnetic fields, such as, for example, the electrical fields and/or the magnetic fields generated by other live conductors located nearby.

BACKGROUND OF THE INVENTION

At the present the known feedthrough insulator are not able to sense the electric field and/or the magnetic field generated by the live connecting rod and, besides, they are not able to sense the electric field and/or the magnetic field generated by the live connecting rod without being affected by the surrounding electrical fields and/or magnetic fields generated by other live conductors located nearby.

OBJECT OF THE INVENTION

The object of the present invention is to overcome the aforementioned drawbacks.

The invention, which is defined in the claims, resolves the problem of creating a feedthrough insulator characterized by the fact to comprise:

a central connecting rod which extends along a longitudinal axis;

a sleeve positioned coaxial around the connecting rod with the respective circular shell radially spaced with respect to the central rod;

a sensor of electric field and/or of magnetic field positioned in proximity of the inner surface of the shell of the sleeve; and a support body formed by dielectric material able to contain and to embed the central rod the sleeve and the sensor.

BRIEF DESCRIPTION OF THE DRAWING

The following description of the capacitive sensor proposed by the present invention, in various practical embodiments, is provided by way of non-limiting example and makes reference to the appended drawings, in which.

SPECIFIC DESCRIPTION OF THE INVENTION

First Embodiment

Figure 1:
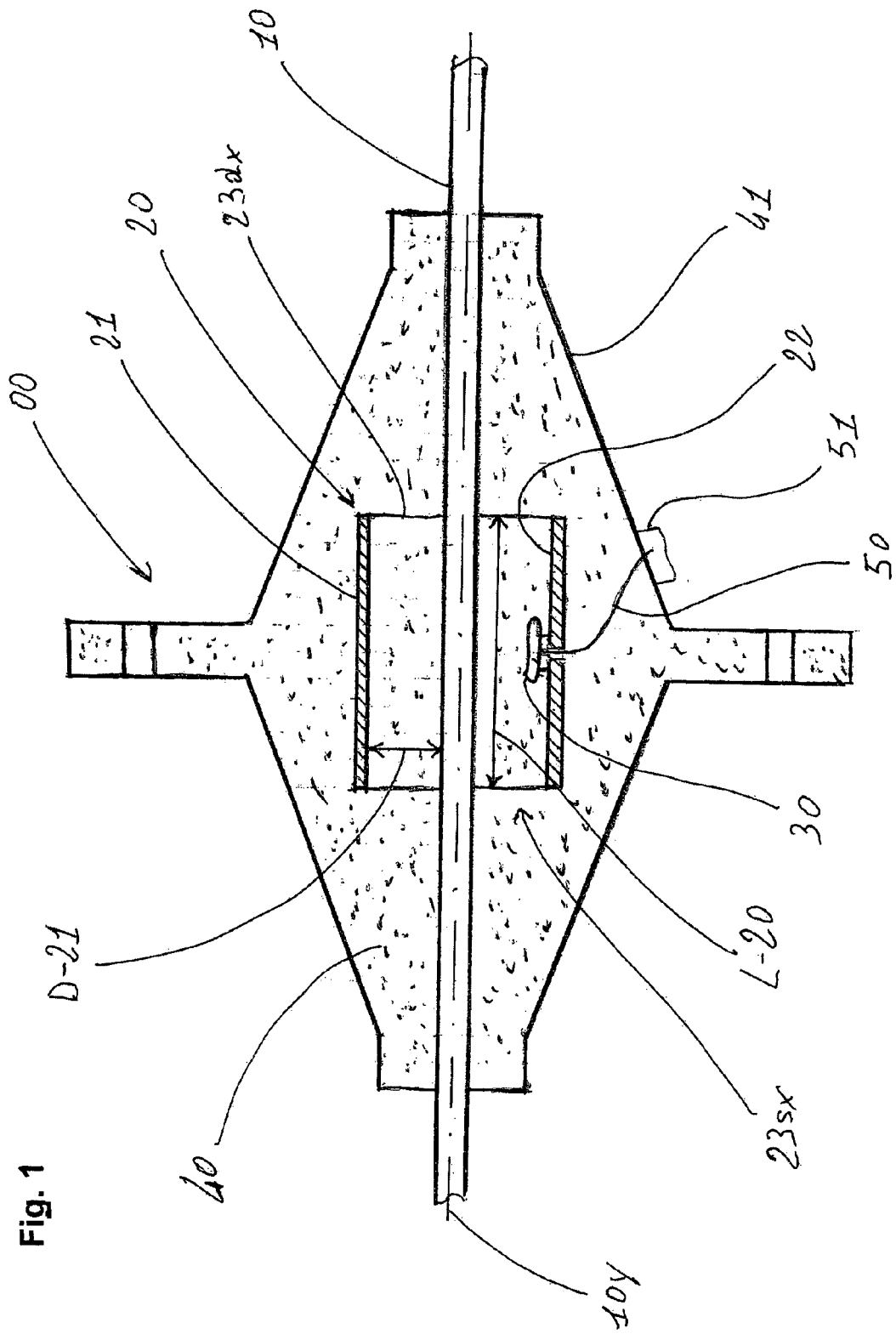
FIG. 1 shows schematically a first embodiment of the feedthrough insulator as a section view with respect to a longitudinal central plan.

With reference to FIG. 1 it illustrates a first embodiment of the feedthrough insulator insulating according to the present invention and, more particularly, a basic embodiment.

The basic feedthrough insulator, here indicated with 00, substantially comprises:

a central connecting rod 10 which extends along a longitudinal axis 10$y$;

a sleeve 20 positioned coaxial around the connecting rod 10 with the respective shell 21 radially spaced D-21 with respect to the central rod 10;

a sensor 30 of electric field and/or of magnetic field positioned in proximity of the inner surface 22 of the shell 21 of the sleeve 20, in which the sensor 30 has preferably the form of a diskette;

a support body 40 formed by dielectric material, having a conic-cylindrical conformation, and able to contain and/or to position and/or to englobe the central rod 10, the sleeve 20 and the sensor 30 of electric field and/or magnetic field.

Furthermore, by way of non-limiting example, the feedthrough insulator 00 can further comprise a conductor 50 which is able to connect the sensor 30 of electric field and/or of magnetic field with a device 51 positioned on the external surface 41 the body 40 of dielectric material, in which the device 51 can be a device for connection or a display device, as for example an unit able to elaborate the signals received by the conductor 50 and able to indicate on a display the voltage and/or the current sensed, or a different device.

With reference to FIG. 1, the sleeve 20 has a longitudinal length L-20 and the sensor 30 of electric field and/or of magnetic field is positioned in an intermediary point with respect to the longitudinal length L-20, in which the longitudinal length L_20 has a length able to prevent the harmful-undesired electrical field lines generated by surrounding conductors to impinge on the sensor 30.

The sleeve 20 is preferably connected to earth or to a reference potential and, furthermore, the distance D-21 between the sleeve 20 and the rod 10 is preferably a minimum distance such that the dielectric strength of the dielectric body 40 is not exceeded, thus ensuring the requisite degree of insulation.

The sensor 30 of electric field and/or of magnetic field is electrically spaced with respect to the rod 10 with a minimum distance such that the dielectric strength of the dielectric body is not exceeded, thus ensuring the requisite degree of insulation.

Description of the Second, Third and Fourth Embodiment

Figure 2:
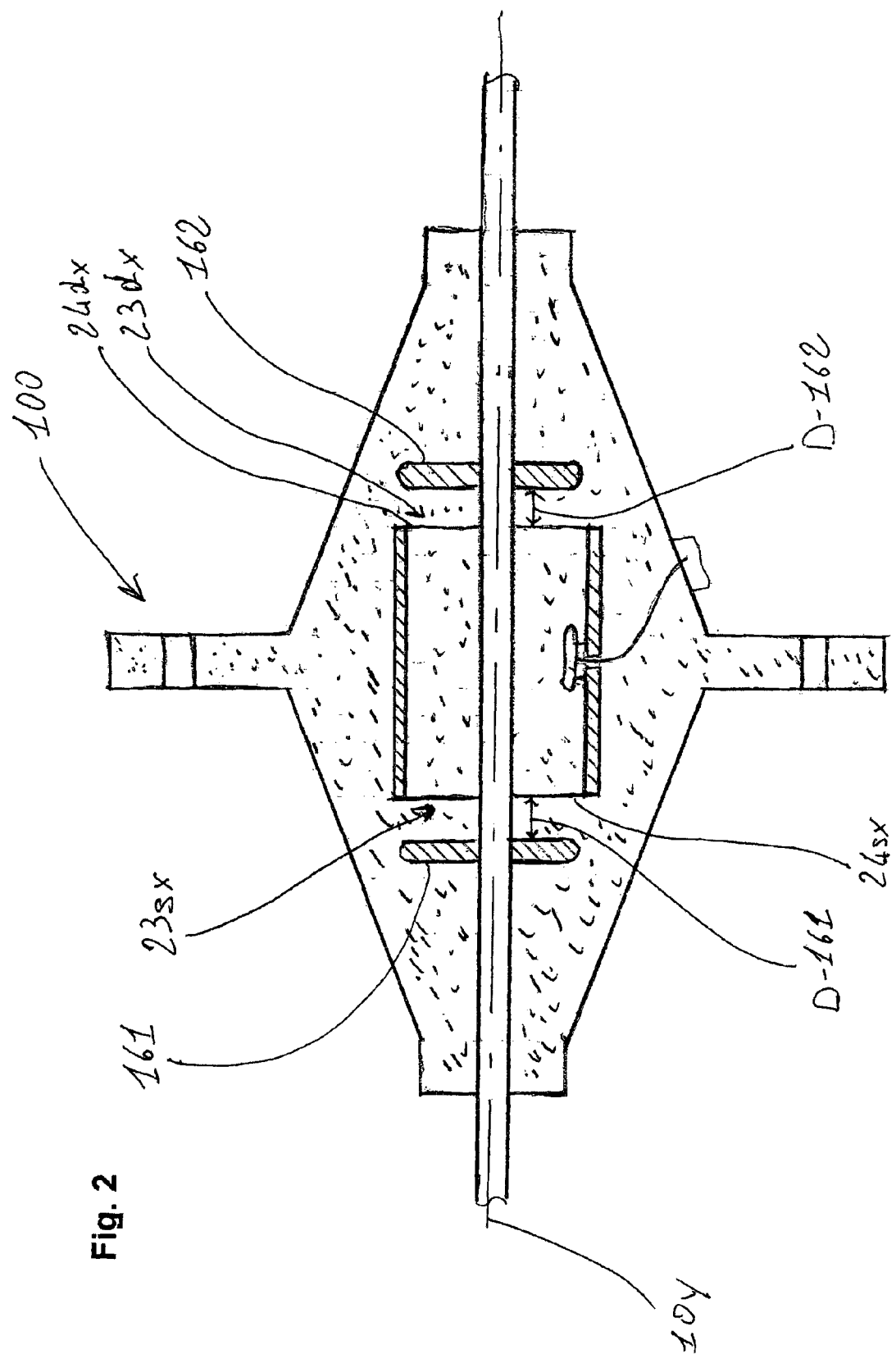
FIG. 2 shows schematically a second embodiment of the feedthrough insulator as a section view with respect to a longitudinal central plan.
Figure 3:
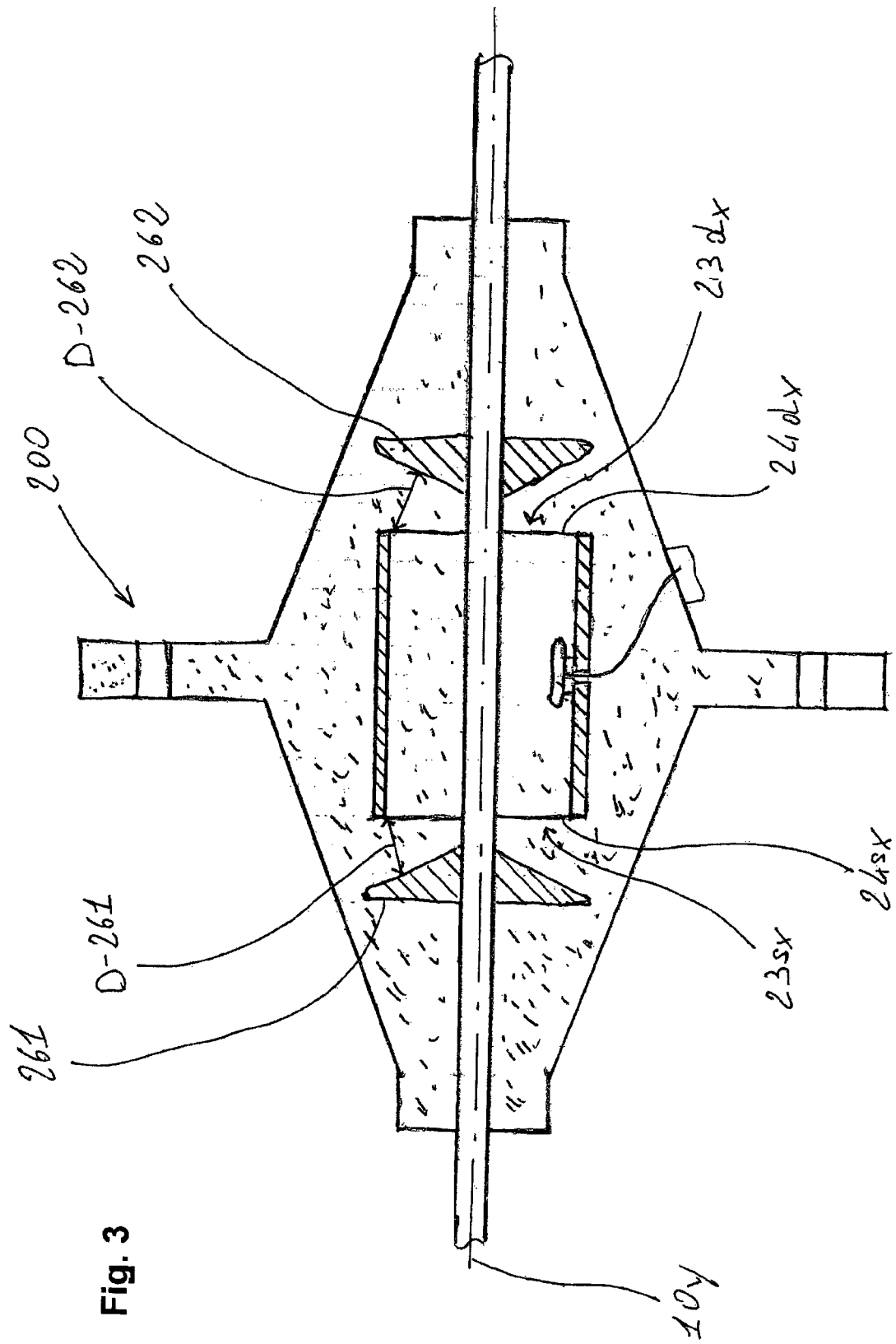
FIG. 3 shows schematically a third embodiment of the feedthrough insulator as a section view with respect to a longitudinal central plan.
Figure 4:
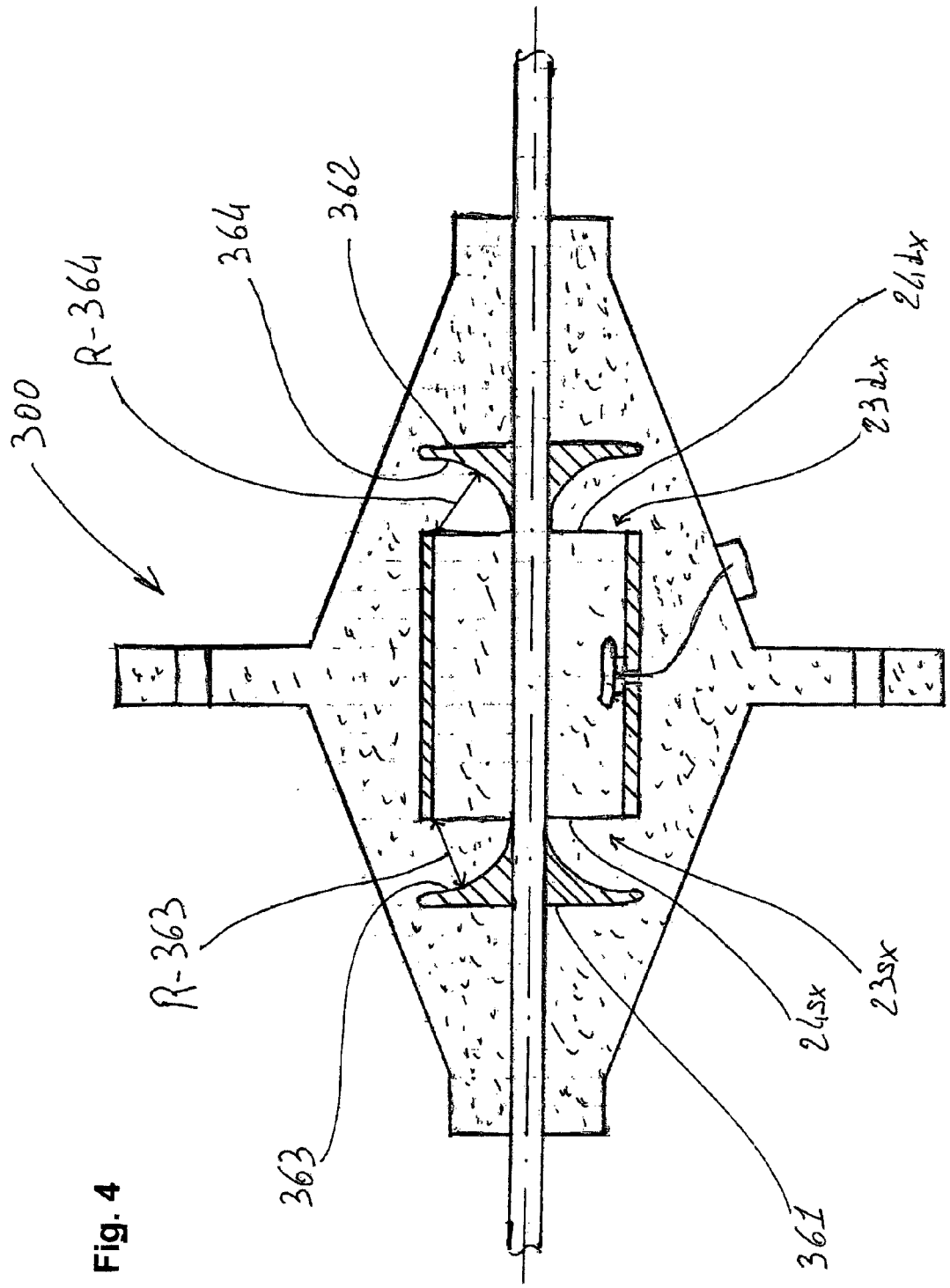
FIG. 4 shows schematically a fourth embodiment of the feedthrough insulator as a section view with respect to a longitudinal central plan.

With reference to the FIG. 2, FIG. 3 and FIG. 4, they, respectively, illustrate a second, a third and a fourth embodiment of the feedthrough insulator according to the present invention.

With reference to the second, third and fourth embodiments, indicated with 100, 200, 300, in the respective FIGS.

2, 3 and 4, the feedthrough insulator comprises a rod 10, a sleeve 20, a sensor 30 and a support body 40 of dielectric material as in the first embodiment 00 of FIG. 1 and, furthermore, at least a screen element, indicated with 161 or 162 in FIG. 2, with 261 or 262 in FIG. 3, with 361 or 362 in FIG. 4, in which the screen element 161/162 261/262 361/362 is positioned near of at least one of the two openings 23sx and 23dx configured on the opposite longitudinal ends of the sleeve 20, in which the screen element, 161 or 162 in FIG. 2, 261 or 262 in FIG. 3, 361 or 362 in FIG. 4, is able to screen the entry of the harmful-undesired electrical field lines generated by other surrounding live conductors, so that the harmful-undesired electrical field lines do not impinge on the sensor 30.

Preferably, the screen element/s, 161 and/or 162 in FIGS. 2, 261 and/or 262 in FIGS. 3, 361 and/or 362 in FIG. 4, is/are put on (around) the rod 10 and, for the reasons that will result subsequently, put on (around) the rod 10 in a longitudinally slidable and longitudinally adjustable manner.

In this context, for example, the rod 10 can be equipped with an external thread while the screen element/s, 161 and/or 162 FIGS. 2, 261 and/or 262 in FIGS. 3, 361 and/or 362 in FIG. 4, can be equipped with an internal thread, in which the two threads are fit together, with the purpose to allow the longitudinal translation/positioning of the screen elements with respect to the rod 10.

Detailed Description of the Second Embodiment

With reference to FIG. 2 the illustrated second embodiment is here indicated with 100.

In the second embodiment at least a screen element is shaped in the form of a disk, 161, 162, and the disk, 161, 162, is positioned to a determined longitudinal distance, D-161, D-162, with respect to the respective longitudinal end, 24sx, 24dx, of the sleeve 20, in which the distance, D-161, D-162, is preferably the minimum distance such that the dielectric strength of the dielectric body 40 is not exceeded, thus ensuring the requisite degree of insulation.

Detailed Description of the Third Embodiment

With reference to FIG. 3 the illustrated third embodiment is here indicated with 200.

In the third embodiment at least a screen element is shaped in the form of a truncated cone, 261, 262, with smaller basis oriented toward a respective opening, 23sx, 23dx, of the sleeve 20.

The screen element, 261, 262, in the for of a truncated cone is positioned to a determined longitudinal distance, D-261, D-262, with respect to the respective longitudinal end, 24sx, 24dx, of the sleeve 20, in which the distance, D-261, D262, is preferably the minimum distance such that the dielectric strength of the dielectric body 40 is not exceeded, thus ensuring the requisite degree of insulation.

Detailed Description of the Fourth Embodiment

With reference to the FIG. 4 the illustrated fourth embodiment is here indicated with 300. ?

The fourth screen element 361, 362 is shaped in the form of a funnel with a stem oriented toward the opening, 23sx, 23dx, of the sleeve 20.

The funnel-shaped screen element 361, 362, has its sides, 363, 364, with a profile rounded in a convex manner with respect to the longitudinal axis lOy of the rod 10.

More in particular the funnel, 361, 362, has the sides, 363, 364, rounded in a convex manner with respect to the longitudinal axis by of the rod 10 with a radius of curvature having determined length, indicated with R-363 and R-364, in which the length of the radius of curvature, R-363, R-364, preferably correspond to the minimum distance to be maintained between the circular perimeter, 24sx, 24dx, of the sleeve 20 with respect to the funnel, 361, 362, such that the dielectric strength of the dielectric body 40 is not exceeded, thus ensuring the requisite degree of insulation.

Furthermore, the funnel-shaped screen element 361, 362, is positioned next to the respective opening, 23sx, 23dx, of the sleeve 20 and spaced with respect to the sleeve with a distance equal to the length of the radius R-363, R-364, of the rounded sides of the funnel 361, 362.

The invention claimed is:

1. A feedthrough insulator comprising:
    a central connecting rod extending along a longitudinal axis;
    a cylindrical sleeve coaxial to and surrounding the connecting rod and radially outwardly spaced from the connecting rod;
    a sensor of electric or magnetic field positioned in proximity to an inner surface of the sleeve;
    a dielectric support body containing and embedding the central rod, the sleeve and the sensor; and
    at least one electrified screen element positioned near at least one of two opposite longitudinal open ends of the sleeve, at a reference potential, and positioned to screen entry of harmful-undesired electrical field lines generated by surrounding conductors so that the harmful-undesired electrical field lines do not impinge the sensor.

2. The feedthrough insulator according to claim 1, further comprising:
    a conductor connecting the sensor with a device positioned on an external surface of the body.

3. The feedthrough insulator according to claim 1, wherein the sleeve has a longitudinal extension and the sensor is positioned in an intermediate point with respect to the longitudinal extension.

4. The feedthrough insulator according to claim 1, wherein the sleeve has a longitudinal length able to prevent harmful-undesired electrical field lines generated by surrounding conductors to impinge the sensor.

5. The feedthrough insulator according to claim 1, wherein the sensor is electrically isolated from the sleeve.

6. The feedthrough insulator according to the claim 1, wherein the at least one conductive screen element is mounted on the rod.

7. The feedthrough insulator according to claim 1, wherein the at least one screen element is longitudinally slidable and longitudinally adjustable on the rod.

8. The feedthrough insulator according to claim 1, wherein the rod is equipped with an external thread, the screen element being equipped with an internal thread, the threads fitting together so as to allow longitudinal positioning of the screen element on the rod.

9. The feedthrough insulator according to claim 1, wherein the at least one screen element is a disk.

10. The feedthrough insulator according to claim 9, wherein the disk is positioned at a predetermined longitudinal spacing from the respective longitudinal end of the sleeve, the spacing being such that a dielectric strength of the dielectric body is not exceeded.

11. The feedthrough insulator according to claim 1, wherein the at least one screen element is a frustocone with a smaller end oriented toward a respective open end of the sleeve.

12. The feedthrough insulator according to claim 11, wherein the frustocone is positioned at a predetermined longitudinal spacing from a respective longitudinal end of the sleeve, the spacing being the minimum spacing such that the dielectric strength of the dielectric body is not exceeded.

13. The feedthrough insulator according to claim 1, wherein the at least one screen element is a funnel with a stem oriented toward an opening of the sleeve.

14. The feedthrough insulator according to claim 13, wherein sides of the funnel have a profile rounded in a convex manner with respect to the longitudinal axis of the rod.

15. The feedthrough insulator according to claim 14, wherein the funnel is positioned next to a respective end of the sleeve and spaced with respect to the sleeve at a spacing equal to a length of the radius of the rounded sides of the funnel.

16. The feedthrough insulator according to claim 13, wherein sides of the funnel are rounded in a convex manner with respect to the longitudinal axis of the rod with a radius of curvature having a predetermined length corresponding to the minimum spacing to be maintained between the circular perimeter of the sleeve with respect to the funnel such that the dielectric strength of the dielectric body is not exceeded.

* * * * *